(12) United States Patent
Iguchi et al.

(10) Patent No.: US 6,319,815 B1
(45) Date of Patent: Nov. 20, 2001

(54) ELECTRIC WIRING FORMING METHOD WITH USE OF EMBEDDING MATERIAL

(75) Inventors: Etsuko Iguchi, Tokyo; Masakazu Kobayashi; Yasumitsu Taira, both of Kanagawa, all of (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 09/419,951

(22) Filed: Oct. 18, 1999

(30) Foreign Application Priority Data

Oct. 21, 1998 (JP) .................................................. 10-299190

(51) Int. Cl.[7] ..................... H01L 21/4763; H01L 21/461; H01L 21/31
(52) U.S. Cl. .......................... 438/624; 438/623; 438/634; 438/638; 438/737; 438/738; 438/780; 438/781
(58) Field of Search ..................................... 438/622–624, 438/634, 637–640, 660–663, 735–738, 780, 781

(56) References Cited

U.S. PATENT DOCUMENTS 5,368,783 * 11/1994 Kobayashi et al. ................... 252/600

FOREIGN PATENT DOCUMENTS 10-112503 4/1998 (JP) .
10223755 8/1998 (JP) .

OTHER PUBLICATIONS

Hawley's Condensed Chemical Dictionay, revised by Sax and Lewis, 11th ed., Van Nostrand Reinhold Company, 1987, p.939.*

Kadomura et al. *Semiconductor World*, Jan. 1988 pp. 108–19, Press Journal Inc.

* cited by examiner

Primary Examiner—Ha Tran Nguyen
(74) Attorney, Agent, or Firm—Merchant & Gould P.C.

(57) ABSTRACT

A method for forming a wiring structure on a semiconductor substrate, comprising the following steps: a step for forming a low dielectric constant dielectric film and an etching stopper, sequentially, on said semiconductor substrate; a step for forming a resist mask having a pattern for forming via-holes on the etching stopper film; a step for forming via-holes on the low dielectric constant dielectric film through said resist mask; a step for filling said via-holes with an embedding material and for heating the embedding material to harden; a step for maintaining the embedding material at a predetermined thickness on the bottoms of the via-holes by performing etching back on the embedding material being heated to be harden; a step for forming a resist mask having a pattern for forming trench holes on said etching stopper film; a step for forming the trench holes on said low dielectric film constant dielectric through said resist mask, while removing the embedding material remaining on the bottoms of said via-holes; and a step for embedding metal into said trench holes and said via-holes, wherein the embedding material mainly includes a thermo-bridge forming compound therein, thereby generating no bubbles even when said embedding material is being filled into gutters having a large aspect ratio thereof.

5 Claims, 5 Drawing Sheets

ELECTRIC WIRING FORMING METHOD WITH USE OF EMBEDDING MATERIAL

BACKGROUND OF THE INVENTION

1. Field of the Invention

The present invention relates to a method for forming an electric wiring structure with the use of an embedding material for use in filling up the via-holes thereof, in particular when forming a multi-layer wiring structure therewith.

2. Description of Prior Art

FIG. 1 shows a general method for forming a multi-layer wiring structure.

In the forming method of the multi-layer wiring structure according to the conventional art, first, as shown in FIG. 1(a), a film of aluminum (Al) is formed on a substrate, and on the film a resist mask is prepared on which a pattern is formed. Then, as shown in FIG. 1(b), the aluminum (Al) film is selectively etched by reactive ion etching (RIE) to remove the resist mask, thereby forming a lower layer of wiring. Next, as shown in FIG. 1(c), SOG (i.e., spin on glass: a liquid dissolving silicon compound into organic solvent, such as alcohol, etc.) is applied and baked (though the SOG layer is provided directly on the Al wiring in FIG. 1(c), an insulating layer may be provided between the layers of the Al wiring and the SOG layer through a plasma CVD method), and then, as shown in FIG. 1(d), it is flattened by etching back. Further, as shown in FIG. 1(e), the SOG is applied on the flattened surface and is baked, and the via-holes are formed by selectively etching on the SOG film through the resist mask prepared thereon, as shown in FIG. 1(f). Into said via-holes, Al or the like is embedded or filled, and further, as shown in FIG. 1(g), an aluminum (Al) film is formed and is etched so as to form an upper layer of wiring, in the same manner as in the above, as shown in FIG. 1(h). Then, as shown in FIG. 1(i), the SOG is applied for filling up between the upper layer wiring, thereby forming the multi-layer wiring structure.

However, most of the actual multi-layer wiring structures are made to five (5) layers or more, by applying the etching technology mentioned above.

The requirement for high integration of the semiconductor devices is continually rising, and now we are rushing into an age of 0.15 $\mu$m gate lengths. It is already recognized that, by using Cu as the wiring material in place of the conventional Al in such instances, improvements in the characteristics of the semiconductor elements produced can be obtained, in particular in the following aspects.

Cu is superior to Al in tolerance or durability to EM (i.e., electromigration), and is low resistance, therefore it is possible to reduce signal delay due to the wiring resistance, and use under high current density is possible, i.e., an allowable current density can be raised to three (3) times as large or more, thereby enabling fine or narrow wiring widths to be made.

However, since the etching of Cu is difficult compared to Al, a copper damascene method attracts attention as a method for realizing the multi-layer wiring of Cu without etching thereof.

Explanation of the copper damascene method will be given with reference to FIG. 2.

First, as shown in FIG. 2(a), an insulating film of $SiO_2$ or SOG is formed between the substrate and resist mask. It is formed on the substrate through a CVD method, and on the $SiO_2$ or SOG layer a resist mask is prepared. By selectively etching and removing the resist mask, wiring gutters are formed, as shown in FIG. 2(b). Next, as shown in FIG. 2(c), said wiring gutters are lined with barrier metal, and as shown in FIG. 2(d), Cu is embedded or filled into the gutters by means of an electrolysis plating so as to form the lower layer wiring. After polishing the barrier metal and Cu with CMP (chemical mechanical polishing), and forming barrier metal thereon in addition, as shown in FIG. 2(e), an insulating film between layers is then formed on the new layer. Hereinafter, in the same manner, by selectively etching the insulating film between layers through the resist mask on which a pattern is formed, as shown in FIG. 2(f), the via-holes (or contact holes) and trench holes (i.e., the gutters for the upper layer wiring) are formed (i.e., dual damascene), and as shown in FIG. 2(g), Cu is embedded or filled into the via-holes and the gutters for the upper layer wiring by means of electrolysis plating or the like, thereby forming the upper layer wiring.

The dual damascene method, for forming the via-holes and the trench holes in the insulating film between layers mentioned above, is disclosed for example in a monthly "Semiconductor World", January, 1998, on pages 108 and 109, and the details thereof will be explained by referring to FIGS. 3 and 4, below.

In the method shown in FIG. 3, first of all, as shown in FIG. 3(a), on the semiconductor substrate are formed a first low dielectric constant dielectric film, a first etching stopper film, a second low dielectric constant dielectric film and a second etching stopper film sequentially and respectively. Next, as shown in FIG. 3(b), on the second etching stopper film a resist mask having a pattern for forming the via-holes is formed, and then, as shown in FIG. 3(c), the via holes are formed through the resist mask to the bottom of the first low dielectric film constant dielectric. As shown in FIG. 3(d), after filling an embedding material, such as a photo resist or the like into the via-holes and heating to harden, as shown in FIG. 3(e), the embedding material being heated for hardening thereof is etched back so that a predetermined thickness of the embedding material remains on the bottom of each of the via-holes. Furthermore, as shown in FIG. 3(f), a resist mask having a pattern for forming the trench holes therein is formed on the second etching stopper film, and then, as shown in FIG. 3(g), the trench holes are formed in the second low dielectric film constant dielectric through the resist mask, while removing the remaining embedding material from the bottom of each of the via-holes, and thereafter, a metal such as Cu or the like is embedded or filled into the trench holes and the via-holes.

In the method shown in FIG. 4, first of all, as shown in FIG. 4(a), on the semiconductor substrate are formed a low dielectric constant dielectric film and an etching stopper film sequentially, and then as shown in FIG. 4(b), a resist mask having a pattern for forming via-holes is formed on the etching stopper film. Next, as shown in FIG. 4(c), the via-holes are formed in the low dielectric constant dielectric film through the resist mask, and as shown in FIG. 4(d), the embedding material, such as the photo resist is filled into the via-holes. After heating the embedding material for hardening thereof, as shown in FIG. 4(e), said embedding material is etched back so that a predetermined thickness thereof remains on the bottom of each of the via-holes. Furthermore, as shown in FIG. 4(f), a resist mask having a pattern for forming trench holes is formed on the etching stopper film, and as shown in FIG. 4(g), the trench holes are formed in the low dielectric constant dielectric film through the resist mask, while removing the remaining embedding material from the bottom of each of the via-holes, and thereafter, metal is embedded or filled into the trench holes and the via-holes.

Further, there is known a dual damascene method other than the dual damascene method mentioned above, which does not make use of an embedding material such as the photo resist, and in which the trench holes are formed in advance, and then the via-holes are formed.

In the dual damascene method mentioned in the previous paragraph, when forming the trench holes through the etching after forming the via-holes, the surface of the substrate is damaged by the etching gas if it is exposed from the bottom of the via-holes. This causes defects in the wiring formed and so on. Therefore, the photo resist compound is embedded into the bottom of the via-holes as a protection film from said etching gas.

Sometimes, an aspect ratio (i.e., height/width) of the via-holes and the trench holes formed with the dual damascene method comes to be 4–5 or more. Therefore there is a requirement for the embedding material to be embedded into gutters with said aspect ratio.

However, since the photo resist compound generates bubbles, when trying to fill gutters with an aspect ratio of 4–5 or more, said photo resist compound, cannot be filled into them completely so as to form the protection films, when applying the photo resist as the embedding material, it is impossible to maintain the necessary film thickness of protection film on the bottoms of the via-holes after the exposure and development thereof.

Therefore, conventionally it is good practice to adjust the amount of the photosensitive component having high light absorption capacity. However, there is a problem that, if light absorption capacity is too high, the penetrativity of the exposure light is deteriorated so that the resolution of the resist is reduced. While if light absorption capacity is too low, said resist is entirely exposed by the exposure light, thereby making it impossible to maintain the necessary thickness of the film.

SUMMARY OF THE INVENTION

According to the present invention, for dissolving the problems mentioned above, a method is provided for forming electric wiring, in which the trench holes are formed under the condition where the bottoms are filled with an embedding material for use in fine or narrow gutters, when forming the wiring through the dual damascene method shown in FIGS. 3 and 4. The embedding material for use in fine or narrow gutters, according to the present invention, is prepared by dissolving mainly a thermo-bridge forming compound into an organic solvent, for example.

Compounds which can be listed as the above-mentioned thermo-bridge forming compound are, a melamine derivative, a guanamine derivative, a glycoluril derivative, a urea derivative, a succinylamide derivative, etc., wherein the amino substituent(s) thereof is substituted by a hydroxyalkyl or alkoxyalkyl radical, or both.

Examples of the above-mentioned derivatives are methoxymethylated melamine, methoxymethylated butoxymethylated melamine, butoxymethylated melamine, methoxymethylated isobutoxymethylated melamine containing carboxyl group, methoxymethylated benzoguanamine, methoxymethylated ethoxymethylated benzoguanamine, methoxymethylated butoxymethylated benzoguanamine, butoxymethylated benzoguanamine, methoxymethylated ethoxymethylated glycoluril containing carboxyl group, methylolated benzoguanamine, butoxymethylated glycoluril, and methoxymethylated glycoluril. Among those, the compound which has a triazine ring in the structure thereof is preferable, and further, in particular methoxymethylated benzoguanamine is the most preferable. Also, those derivatives can be used by combining at least two kinds thereof, or more.

As the organic solvent, any organic solvent may be used, into which the thermo-bridge forming compound can be dissolved. Also, as the organic solvent, a mono-hydric alcohol including, such as methyl alcohol, ethyl alcohol, propyl alcohol, butyl alcohol or the like; a polyhydric alcohol including, such as ethylene glycol, di-ethylene glycol, propylene glycol or the like; a polyhydric alcohol derivative including, such as ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, propylene glycol monobutyl ether, ethylene glycol monomethyl ether acetate, ethylene glycol monoethyl ether acetate, propylene glycol monomethyl ether acetate, propylene glycol monoethyl ether acetate or the like; and a fatty acid including, such as acetic acid, propionic acid or the like may be used. Those organic c solvents can be used alone or by combining at least two kinds thereof or more. Among those, propylene glycol monomethyl ether and propylene glycol monomethyl ether acetate are preferably used.

The distribution ratio of the thermo-bridge forming compound and the organic solvent is not restricted especially. Namely, if the thermo-bridge forming compound having the same nucleus of 5–6 is used, the higher the concentration is, the thicker the obtained film, and the lower the concentration, the thinner the obtained film. From this, the distribution ratio of the thermo-bridge forming compound and the organic solvent should be determined depending upon the desired thickness of the film to be formed, however, when taking into consideration the embedding characteristics of the substrate upon which patterns being less than 0.2 μm (according to a tendency of miniaturization of semiconductors) are formed, it is preferable to select the distribution (i.e., thermo-bridge forming compound/ (thermo-bridge forming compound+organic solvent)) to be from 0.1 wt % to 50 wt %, more preferably from 0.5 wt % to 30 wt %.

Conventionally, as shown in FIG. 2, after filling a embedding material into via-holes so that the via-holes are completely embedded, the embedding material is kept at a predetermined thickness on the bottom of the via-holes by performing etching back on the embedding material. However, particularly in a case where the ratio of the thermo-bridge forming compound is reduced to the extent from 0.1 wt % to 3.5 wt %, as shown in FIGS. 5(c) and(d), it is possible to directly fill an embedding material having a predetermined thickness on the bottom of via-holes without performing etching back.

Also, it is possible to add an additive or a surfactant, etc., depending upon necessity thereof. As the additive, it may be a compatible one which can be applied as an acceleration agent for the bridge reaction, and as examples, a type of carboxylic acid, such as oxalic acid, a maleic acid, o-hydroxy benzoic acid, 3,5-dinitro benzoic acid, 2,6-dihydroxy benzoic acid, SAX (produced by Mitsui tohatsu Kagaku, Co.) which is available on the market, etc.; Idan organic acid ester, such as ester of P-toluene sulfonic acid and dialkyl amino alcohol; 2,2',4,4'-tetrahydroxy benzophenone, etc., can be added within a range being less than 5 wt % with respect to the compound, which has the thermo-bridge forming compound characteristic and is alkali-insoluble after the thermo-bridge forming reaction. Further, it is possible to add the surfactant for the purpose of improvement of application and of protection from striation. Compounds which can be listed as the surfactant include a fluorine group, including Surflon SC-103, SR-100 (produced by Asahi Glass, Co.), EF-351 (produced by Tohoku-hiryo, Co.), Florade Fc-431, Florade Fc-135, Florade Fc-98, Florade Fc-430, Florade Fc-176 (produced by Sumitomo 3M, Co.), etc., and it is preferable to select an additional amount thereof within a range being less than 200 ppm with respect to the thermo-bridge forming compound. Also, if a component other than this, having high absorbance, is contained as the constituent, as is mentioned previously, it is difficult to make an adjustment of the distribution amount. Therefore, such a component should not be used.

Further, the following fluorine group materials can be used for forming the insulating film between layers; fluoropolyimide, SiOF film, or organic SOG or P-TEOS which are known as materials of a silica group for forming insulating film between layers, and in particular, materials which may be used as the organic SOG, include a compound which is obtained through condensation reaction by hydrolyzing alkoxysilane compound in the presence of an acidic catalyst. The alkoxysilane compound includes at least one type selected from alkoxysilane compounds expressed by a general formula, $RnSi(OR^1)_{4-n}$ (where, R is an alkyl radical or aryl radical of carbon number 1–4, $R^1$ is an alkyl radical of carbon number 1–4, and n is an integer of 1–2).

Furthermore, a film is proposed as the etching stopper film of silicon oxide (not only a film of SiOx (x is an any integer), but also included films which are doped with P, B, As, etc., (i.e., BPSG film, PSG film, BSG film, or AsSG film, etc.)), or a film of silicon nitride (i.e., SiN film).

Moreover, a first etching stopper and a second etching stopper can be appropriately selected to be utilized, by taking into consideration that the etching rate of the upper layer must be set f aster than that of the lower layer, in relationship to the first and the second etching stoppers in the etching rates thereof. However, the etching rate can be controlled by changing the composition of etching gas. Said etching gas can be a mixture gas of $CF_4$, $CHF_3$ and $O_2$, a mixture gas of $N_2$ and $O_2$, or $Cl_2$ gas, etc.

Further, preferable metals as the material for forming the wiring are Cu and Au, and alloys of Al group, such as Al, Al—Si—Cu, Al—Si, etc. are sufficient.

Also, as the photo resist compound conventional ones can be used, such as a positive-negative type photo resist for i-ray or g-ray, a positive-negative type photo resist of chemical amplifying type, a resist for electron beam, a resist for x-ray, etc., depending upon the purpose thereof. Furthermore, the present invention can be applied when via-holes are less than 0.20 μm in the diameter thereof.

Further, in the present invention, it is possible to further combine inorganic acid or organic acid, including acid residue that contains sulfur. Among those inorganic acids including acid residue that contains sulfur, can be listed sulfuric acid, sulfurous acid, and thiosulfuric acid. However, in particular sulfuric acid is preferable. Sometimes, as the organic acid, including acid residue that contains sulfur, sulfonic acid, organic sulfuric ester, organic sulfurous ester, etc. can be listed. In particular a A compound, such as organic sulfonic acid which can be expressed by a following general formula (II):

(where, $R^7$ in the formula a hydrocarbon radical, and X a sulfonic acid radical.) is preferable.

In the above general formula (II), the hydrocarbon radical of $R^7$ preferably has a carbon number from 1 to 20, and this hydrocarbon radical may be saturated or unsaturated, or in the form of a straight chain-like, branched chain-like, or ring-like structure. Also, as substituents, a sulfonic acid radical, carboxyl radical, hydroxyl radical, amino radical, cyano radical, halogen atom such as fluorine atom, etc. can be listed. Those substituents may be introduced alone or may be introduced by a plurality thereof.

Hydrocarbon group of the $R^7$ may be an aromatic hydrocarbon radical, such as phenyl radical, naphthyl radical, anthryl radical, and in particular, among those the phenyl radical is preferable. Further, on the aromatic ring(s) of the aromatic hydrocarbon radical, it is possible to bond one or more alkyl radical of carbon number 1–20. The hydrocarbon radical of carbon number 1–20 may be saturated or unsaturated, or in the form of straight chain-like, branched chain-like, or ring-like structure. Other than those, said aromatic ring can be substituted by one or more of the following; sulfonic acid radical, carboxyl radical, hydroxyl radical, amino radical, cyano radical, substituents of halogen atom such as fluorine atom, etc.

As the organic sulfonic acid, with respect to an improvement in the shape of the lower portion of the resist pattern, in particular, nonafluorobutanesulfonic acid, methanesulfonic acid, dodecylbenzene sulfonic acid or a mixture thereof is preferable.

Those inorganic and organic acids can be used alone, or in combinations of two or more types of them. The distribution amount thereof, of course being different depending upon the kinds of the acid used. However, said distribution amount (with respect to 100 wt % of the bridge material mentioned above) is normally selected within a range from 0.1 wt % to 10 wt %, more preferably within a range from 1 wt % to 8 wt %.

DETAILED DESCRIPTION OF PREFERRED EMBODIMENTS

Figure 1:
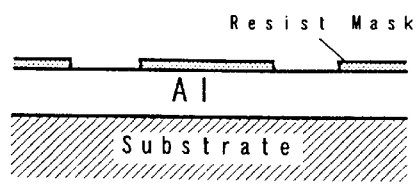
FIG. 1 shows steps for forming a general multi-layer wiring structure according to the conventional art.
Figure 1:
Figure 1:
Figure 1:
Figure 1:
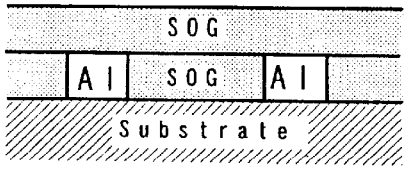
Figure 1:
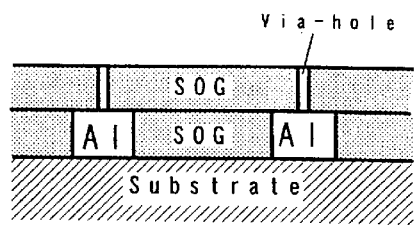
Figure 1:
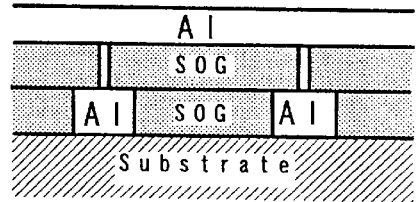
Figure 1:
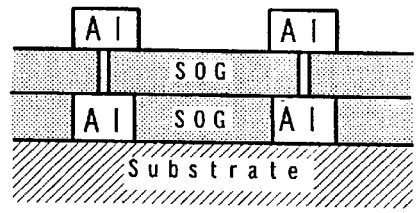
Figure 1:
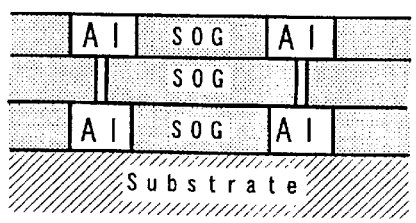
Figure 2:
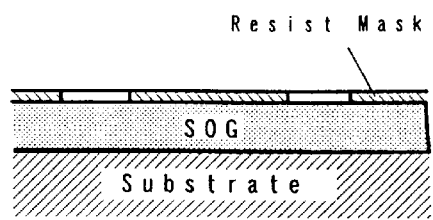
FIG. 2 shows steps for forming a general multi-layer wiring structure according to a copper damascene method.
Figure 2:
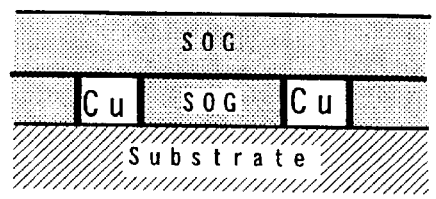
Figure 2:
Figure 2:
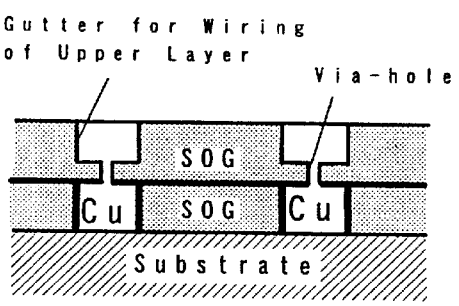
Figure 2:
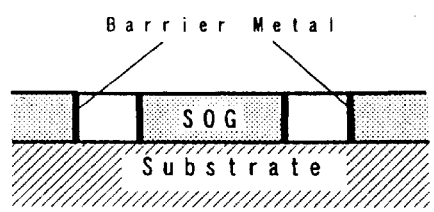
Figure 2:
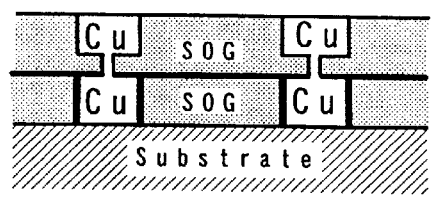
Figure 2:
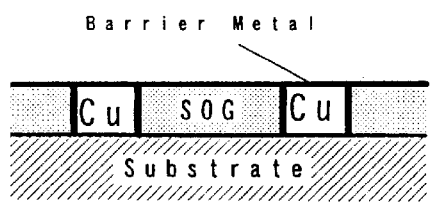
Figure 3:
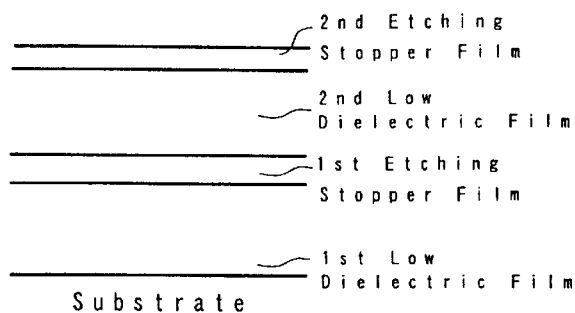
FIG. 3 shows an example of a dual damascene method.
Figure 3:
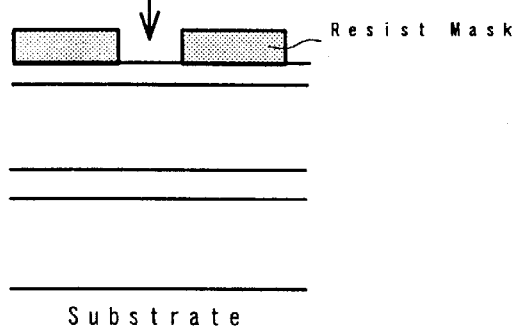
Figure 3:
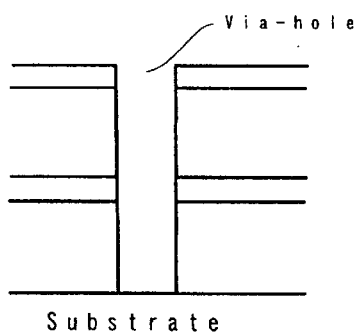
Figure 3:
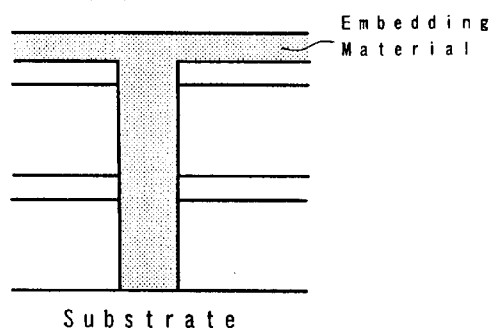
Figure 3:
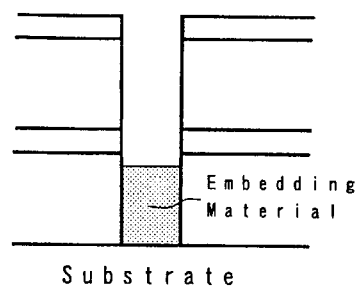
Figure 3:
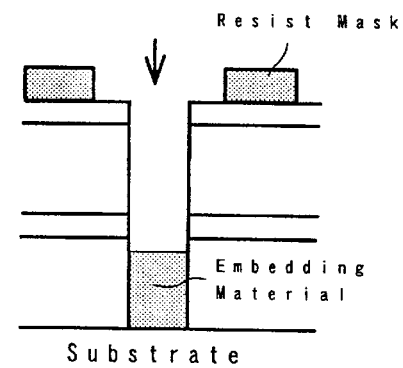
Figure 3:
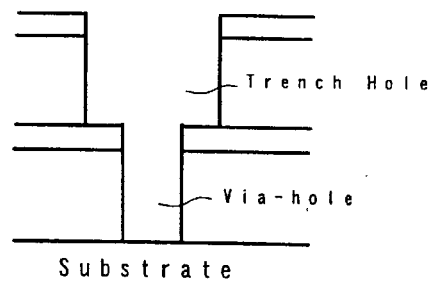
Figure 4:
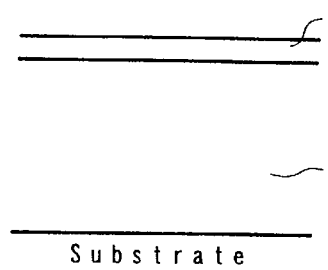
FIG. 4 shows an another example of a dual damascene method.
Figure 4:
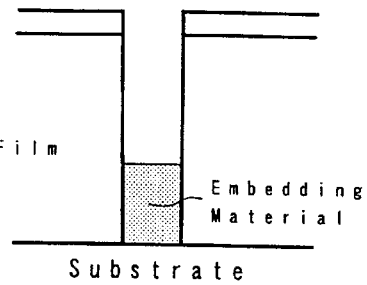
Figure 4:
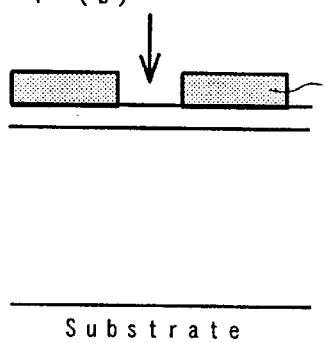
Figure 4:
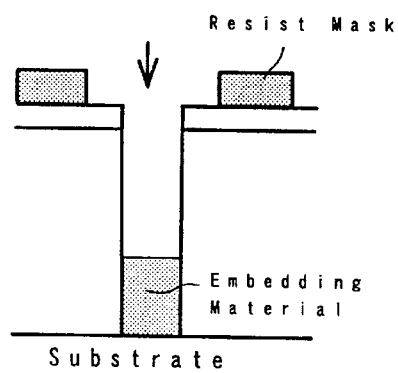
Figure 4:
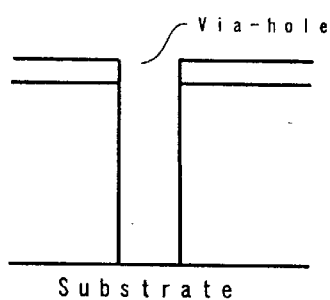
Figure 4:
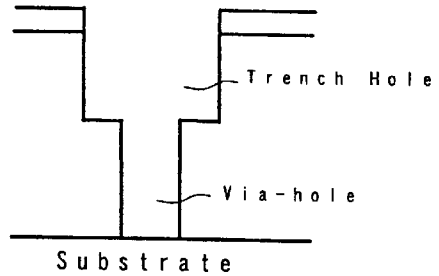
Figure 4:
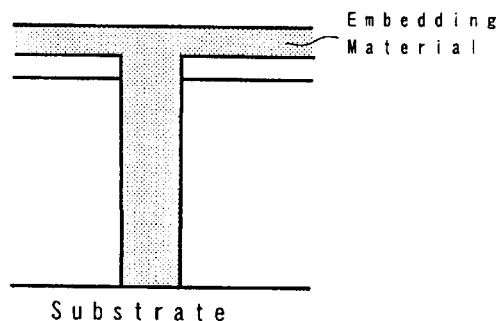
Figure 5:
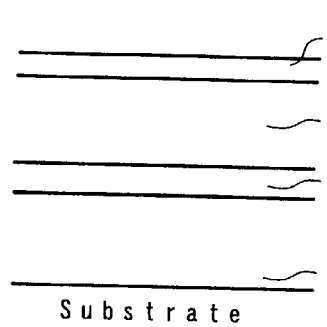
FIG. 5 shows an another example of a dual damascene method which can be achieved by using an embedding material according to the present invention.
Figure 5:
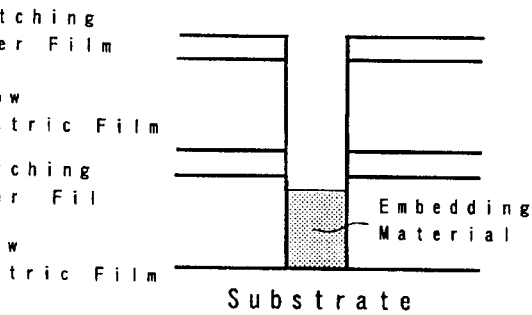
Figure 5:
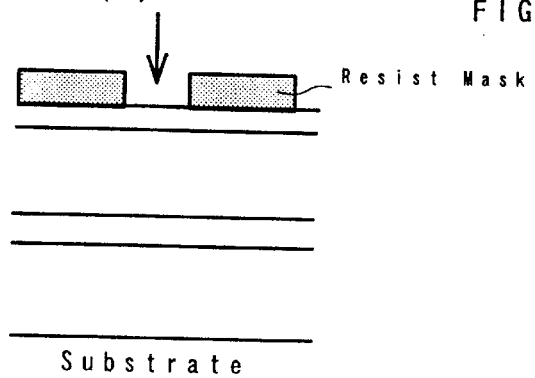
Figure 5:
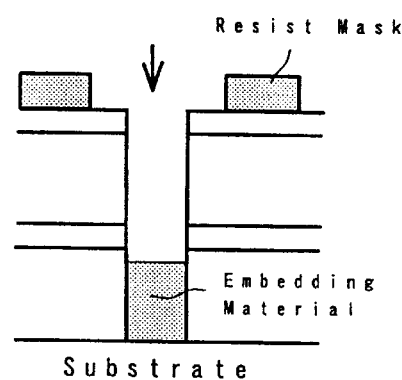
Figure 5:
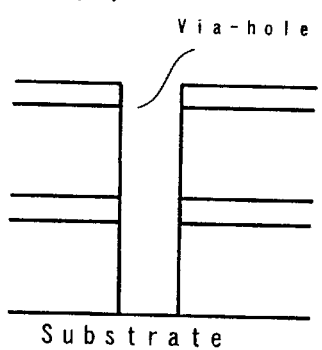
Figure 5:
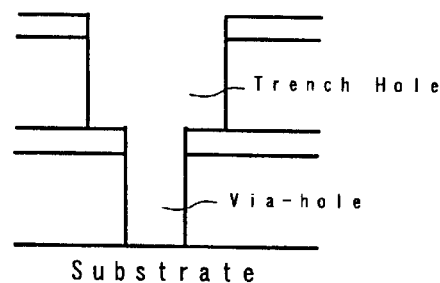

Hereinafter, embodiments according to the present invention will be fully explained by referring to the attached drawings.

(Embodiment 1)

Upon a Si substrate on which a SiN layer is evaporated in advance, an etching stopper layer of $SiO_2$ is formed, which comprises four layers, i.e., a low dielectric layer constant dielectric of organic SOG as the first layer, an etching stopper film of SiN as the second layer, a low dielectric constant dielectric layer of organic SOG as the third layer, and an etching stopper film of $SiO_2$ as the fourth layer. On this substrate a positive type photo resist compound, TDUR-P034 (produced by Tokyo Ohka Kogyo Co., Ltd.) is applied and is baked for 90 seconds at 90° C., thereby obtaining a photo resist layer.

Said photo resist layer is treated with an exposure selectively through a mask pattern, and is developed with a water solution of 2.38 wt % TMAH (tetramethyl ammonium hydroxide). Then, said etching stopper layers and low dielectric layers are etched using a mixture gas of $CF_4$, $CF_3H$ and $O_2$, thereby obtaining the via-holes.

A 30 wt % propylene glycol monomethyl ether acetate solution of methoxymethylated benzoguanamine is embedded into said via-holes, and is heated for 90 seconds at 180° C. Performing etching back on the surface thereof with use of mixture gas of $CF_4$, $CF_3H$ and $O_2$, thereby forms a protection film of the above-mentioned application liquid on the bottom of each of the via-holes.

Upon the substrate on which said protection film layer is formed, again, the resist layer is applied, in the same way mentioned above, so as to form a resist pattern for wiring gutters (i.e., trench holes). Further, etching is performed, thereby forming the wiring gutters.

Further, after the protection film layer is removed and a barrier metal is evaporated thereon, Cu is embedded through a plating method, thereby obtaining a wiring pattern.

(Embodiment 2)

Upon a Si substrate on which a SiN layer is evaporated in advance, a two-ply etching stopper layer is formed, which is made from a low dietric constant dielectric layer of organic SOG as the first ply, and an etching stopper film of SiN as the second ply. On this substrate the positive type photo resist compound, TDUR-P034 (produced by Tokyo Ohka Kogyo Co., Ltd.) is applied and is baked for 90 seconds at 90° C., thereby obtaining a photo resist layer.

On said photo resist layer an exposure is performed selectively through a mask pattern, and is developed with a water solution of 2.38 wt % TMAH (tetramethyl ammonium hydroxide). Then, said each etching stopper layer and low dielectric layer is etched using a mixture gas of $CF_4$, $CF_3H$ and $O_2$, thereby obtaining the via-holes.

Into said via-holes, 30 wt % propylene glycol monomethyl ether acetate solution of methoxymethylated benzoguanamine is embedded and is heated for 90 seconds at 180° C. Performing etching back on the surface thereof using a mixture gas of $CF_4$, $CF_3H$ and $O_2$, thereby forms a protection film of the above-mentioned application liquid on the bottom of each of the via-holes.

Upon the substrate on which said protection film layer is formed, again, the resist layer is applied, in the same operations mentioned above, so as to form a resist pattern for wiring gutters (i.e., trench holes). Further, etching is performed, thereby forming the wiring gutters.

Further, after the protection film layer is removed and a barrier metal is evaporated thereon, Cu is embedded through a plating method, thereby obtaining the wiring pattern.

(Embodiment 3)

A wiring pattern is obtained by the same method in embodiment 1, except that a composition, in which 5 wt % of dodecylbenzensulfonate is added into the 30 wt % propylene glycol monomethyl ether acetate solution of methoxymethylated benzoguanamine with respect to a solid body concentration thereof is used as the embedding material.

(Embodiment 4)

Upon a Si substrate on which a SiN layer is evaporated in advance, an etching stopper layer of $SiO_2$ is formed, which comprises four layers, i.e., a low dielectric constant dielectric layer of organic SOG as the first layer, an etching stopper film of SiN as the second layer, a low dielectric constant dielectric layer of organic SOG as the third layer, and an etching stopper film of $SiO_2$ as the fourth layer. On this substrate a positive type photo resist compound, TDUR-P034 (produced by Tokyo Ohka Kogyo Co., Ltd.) is applied and is baked for 90 seconds at 90° C., thereby obtaining a photo resist layer.

Said photo resist layer is treated with an exposure selectively through a mask pattern, and is developed with a water solution of 2.38 wt % TMAH (tetrarnethyl ammonium hydroxide). Then, said etching stopper layers and low dielectric constant dielectric layers are etched using a mixture gas of $CF_4$, $CF_3H$ and $O_2$, thereby obtaining the via-holes A 1 wt % propylene glycol monomethyl ether acetate solution of methoxymethylated benzoguanamine is embedded into said via-holes on the bottom of the via-holes to a predetermined thickness, and is heated for 90 seconds at 180° C., thereby a protection film of the above-mentioned application liquid is formed on the bottom of each of the via-holes. In this case, etching back in embodiment 1 is not performed.

Upon the substrate on which said protection film layer is formed, again, the resist layer is applied, in the same way mentioned above, so as to form a resist pattern for wiring gutters (i.e., trench holes). Further, etching is performed, thereby forming the wiring gutters.

Further, after the protection film layer is removed and a barrier metal is evaporated thereon, Cu is embedded through a plating method, thereby obtaining a wiring pattern.

(Embodiment 5)

Upon a Si substrate on which a SiN layer is evaporated in advance, a two-ply etching stopper layer is formed, which is made from a low dielectric constant dielectric layer of organic SOG as the first ply, and an etching stopper film of SiN as the second ply. On this substrate the positive type photo resist compound, TDUR-P034 (produced by Tokyo Ohka Kogyo Co., Ltd.) is applied and is baked for 90 seconds at 90° C., thereby obtaining a photo resist layer.

On said photo resist layer an exposure is performed selectively through a mask pattern, and is developed with a water solution of 2.38 wt % TMAH (tetramethyl ammonium hydroxide). Then, said each etching stopper layer and low dielectric constant dielectric layer is etched using a mixture gas of $CF_4$, $CF_3H$ and $O_2$, thereby obtaining the via-holes.

A 0.1 wt % propylene glycol monomethyl ether acetate solution of methoxymethylated benzoguanamine is embedded on the bottom of said via-holes and is heated for 90 seconds at 180° C., thereby a protection film of the above-mentioned application liquid is formed on the bottom of each of the via-holes. In this case, in the same way as embodiment 4, etching back is not performed.

Upon the substrate on which said protection film layer is formed, again, the resist layer is applied, in the same operations mentioned above, so as to form a resist pattern for wiring gutters (i.e., trench holes). Further, etching is performed, thereby forming the wiring gutters.

Further, after the protection film layer is removed and a barrier metal is evaporated thereon, Cu is embedded through a plating method, thereby obtaining the wiring pattern.

(Comparison 1)

Upon a Si substrate on which a SiN layer is evaporated in advance, an etching stopper layer of $SiO_2$ is formed, which comprises four layers, i.e., a low dielectric constant dielectric layer of organic SOG as the first layer, an etching stopper film of SiN as the second layer, a low dielectric constant dielectric layer of organic SOG as the third layer, and an etching stopper film of $SiO_2$ as the fourth layer. On this substrate a positive type photo resist composition, TDUR-P034 (produced by Tokyo Ohka Kogyo Co., Ltd.) is applied and is baked for 90 seconds at 90° C., thereby obtaining a photo resist layer.

On said photo resist layer an exposure is performed selectively through a mask pattern, and is developed with a water solution of 2.38 wt % TMAH (tetramethyl ammonium hydroxide). Then, said etching stopper layers and low dielectric constant dielectric layers are etched using a mixture gas of $CF_4$, $CF_3H$ and $O_2$, thereby obtaining the via-holes.

Into said via-holes, a positive type photo resist composition containing alkali-soluble resin and a photosensitive component, such as THMR-iP3300 (produced by Tokyo Ohka Kogyo Co., Ltd.) is applied, and is baked for 90 seconds at 90° C. Etching is performed back on the surface thereof using a mixture gas of $CF_4$, $CF_3H$ and $O_2$, thereby trying to form a protection film of the above-mentioned resist on the bottom of each of the via-holes.

However, though this positive type resist composition is applied into the via-holes, bubbles are generated, therefore it is impossible to fill or embed said composition into the via-holes, completely without gaps therein.

(Comparison 2)

Upon a Si substrate on which a SiN layer is evaporated in advance, an etching stopper layer of $SiO_2$ is formed, which comprises four layers, i.e., a low dielectric constant dielectric layer of organic SOG as the first layer, an etching stopper film of SiN as the second layer, a low dielectric constant dielectric layer of organic SOG as the third layer, and an etching stopper film of $SiO_2$ as the fourth layer. On this substrate a positive type photo resist composition, TDUR-P034 (produced by Tokyo Ohka Kogyo Co., Ltd.) is applied and is baked for 90 seconds at 90° C., thereby obtaining a photo resist layer.

On said photo resist layer an exposure is performed selectively through a mask pattern, and is developed with a water solution of 2.38 wt % TMAH (tetramethyl ammonium hydroxide). Then, said photo resist layer is etched using a mixture gas of $CF_4$, $CF_3H$ and $O_2$, thereby obtaining the via-holes.

Into said via-holes, a positive type photo resist composition, TDUR-P034 (produced by Tokyo Ohka Kogyo Co., Ltd.) is applied to, and is baked for 90 seconds at 90° C. Performing Etching back on the surface thereof with use of a mixture gas of $CF_4$, $CF_3H$ and $O_2$, thereby forms a protection film of the above-mentioned resist on the bottom of each of the via-holes.

Upon the substrate on which said protection film layer is formed, again, the photo resist layer is applied, in the same operation mentioned above, and is treated with the exposure through the mask pattern and developed. However, all the resists in the hole patterns are exposed, thereby allowing no protection film layer to be retained.

As is fully described in the above, according to the present invention, in the dual damascene method, in particular when the trench holes are formed on the via-holes which are formed in advance, a solution is used as the embedding material for filling up the via-holes, into which is mainly dissolved the thermo-bridge forming composition, such as methoxymethylated benzoguanamine or the like, into the organic solvent, therefore no bubbles are generated therein when being applied into the via-holes, thereby enabling the protection film at a desired thickness thereof to form.

What is claimed is:

1. A method for forming a wiring structure on a semiconductor substrate, comprising following steps:

a step for forming a first low dielectric constant dielectric film, a first etching stopper, a second low dielectric constant dielectric film and a second etching stopper, sequentially on said semiconductor substrate;

a step for forming a first resist mask having a pattern for forming via-holes on the second etching stopper film;

a step for forming via-holes, which pass through to the bottom of the first low dielectric constant dielectric film, through said first resist mask;

a step for filling an embedding material, which mainly includes a thermo-bridge forming compound consisting essentially of a nitrogen containing compound including at least an amino substituent wherein the amino substituent thereof is substituted by a hydroxyalkyl or alkoxyalkyl radical or both therein, into said via-holes, and for heating the embedding material to harden;

a step for etching back on the embedding material being heated to be hardened forming a protection film the bottom of the via holes;

a step for forming a second resist mask having a pattern for forming trench holes on said second etching stopper film;

a step for forming the trench holes on said second low dielectric film through said second resist mask, while removing the embedding material remaining on the bottom of said via-holes; and a step for embedding metal into said trench holes and said via-holes.

2. A method for forming a wiring structure on a semiconductor substrate, comprising the following steps:

a step for forming a low dielectric constant dielectric film and an etching stopper, sequentially on said semiconductor substrate;

a step for forming a first resist mask having a pattern for forming via-holes on the etching stopper film;

a step for forming via-holes on the low dielectric constant dielectric film through said first resist mask;

a step for filling an embedding material, which mainly includes thermo-bridge forming compound consisting essentially of a nitrogen containing compound including at least an amino substituent wherein the amino substituent thereof is substituted by a hydroxyalkyl or alkoxyalkyl radical or both therein, into said via-holes, and for heating the embedding material to harden;

a step for etching back on the embedding material being heated to be hardened forming a protection film the bottom of the via holes;

a step for forming a second resist mask having a pattern for forming trench holes on said etching stopper film;

a step for forming trench holes on said low dielectric film through said second resist mask, while removing the embedding material remaining on the bottoms of said via-holes; and a step for embedding metal into said trench holes and said via-holes.

3. A method for forming a wiring structure on a semiconductor as defined in claim 1, wherein said nitrogen containing compound is a triazine compound.

4. A method for forming wing structure on a semiconductor as defined in claim 3, wherein the triazine compound is benzoguanamine derivative.

5. A method for forming a wiring structure on a semiconductor as defined in claim 1, wherein said nitrogen containing compound is a hydroxyalkyl or alkoxyalkyl triazine compound.

* * * * *